US012193162B2

United States Patent
Otsubo et al.

(10) Patent No.: US 12,193,162 B2
(45) Date of Patent: Jan. 7, 2025

(54) MODULE

(71) Applicant: Murata Manufacturing Co., Ltd., Kyoto-fu (JP)

(72) Inventors: Yoshihito Otsubo, Nagaokakyo (JP); Ryoichi Kita, Nagaokakyo (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 231 days.

(21) Appl. No.: 18/064,492

(22) Filed: Dec. 12, 2022

(65) Prior Publication Data
US 2023/0105809 A1  Apr. 6, 2023

Related U.S. Application Data

(63) Continuation of application No. PCT/JP2021/021339, filed on Jun. 4, 2021.

(51) Int. Cl.
*H05K 1/02* (2006.01)
*H05K 1/11* (2006.01)
(Continued)

(52) U.S. Cl.
CPC ............. *H05K 1/181* (2013.01); *H05K 1/113* (2013.01); *H05K 2201/0341* (2013.01);
(Continued)

(58) Field of Classification Search
CPC .... H05K 1/0216; H05K 1/0218; H05K 1/181; H05K 1/113; H05K 2201/0707;
(Continued)

(56) References Cited

U.S. PATENT DOCUMENTS 11,435,913 B2 * 9/2022 Kaltchev ................. G06F 3/067
2006/0151203 A1 * 7/2006 Krueger ............... H03H 9/1071
29/841
(Continued)

FOREIGN PATENT DOCUMENTS

JP  2002-334954 A  11/2002
JP  2020-025076 A   2/2020
(Continued)

OTHER PUBLICATIONS

International Search Report for PCT/JP2021/021339 dated Aug. 31, 2021.

*Primary Examiner* — Hoa C Nguyen
(74) *Attorney, Agent, or Firm* — Pearne & Gordon LLP

(57) ABSTRACT

A module includes: a substrate having a first surface; a first component mounted on the first surface; a resin film that covers the first component along a shape of the first component, and also covers a part of the first surface; a conductor film that covers at least a part of the resin film along the shape of the first component, and covers at least a part of a portion in which the resin film covers the part of the first surface; and a conductor structure disposed to extend over a part of the resin film. The conductor structure includes a first end portion, a second end portion, and an intermediate portion. The first end portion and the second end portion are connected to the first surface. The intermediate portion is in contact with the conductor film.

20 Claims, 17 Drawing Sheets

(51) Int. Cl.
*H05K 1/18* (2006.01)
*H05K 9/00* (2006.01)

(52) U.S. Cl.
CPC ............... *H05K 2201/0715* (2013.01); *H05K 2201/09481* (2013.01); *H05K 2201/09618* (2013.01); *H05K 2201/10098* (2013.01); *H05K 2201/10287* (2013.01); *H05K 2201/10318* (2013.01); *H05K 2201/10545* (2013.01); *H05K 2201/10734* (2013.01)

(58) Field of Classification Search
CPC ... H05K 2201/0341; H05K 2201/0715; H05K 2201/09481; H05K 2201/09618; H05K 2201/10098; H05K 2201/10287; H05K 2201/10318; H05K 2201/10545; H05K 2201/10734
See application file for complete search history.

(56) References Cited

U.S. PATENT DOCUMENTS

| | | | |
|---|---|---|---|
| 2007/0138614 A1* | 6/2007 | Harrison | H01L 25/0655 257/E23.114 |
| 2011/0229708 A1* | 9/2011 | Asami | H01L 24/97 428/316.6 |
| 2012/0020039 A1 | 1/2012 | Coffy et al. | |
| 2012/0044653 A1* | 2/2012 | Morris | H05K 3/284 361/728 |
| 2012/0140423 A1* | 6/2012 | Fisher, Jr. | H01L 23/552 361/748 |
| 2013/0082367 A1 | 4/2013 | Yoo | |
| 2013/0170147 A1* | 7/2013 | Dang | H01L 24/97 361/728 |
| 2013/0228904 A1* | 9/2013 | Brunnbauer | H01L 23/552 257/659 |
| 2015/0043189 A1* | 2/2015 | Kitazaki | H05K 3/244 29/832 |
| 2019/0393166 A1 | 12/2019 | Otsubo | |
| 2020/0043865 A1 | 2/2020 | Otsubo et al. | |
| 2020/0365476 A1 | 11/2020 | Otsubo et al. | |
| 2021/0066237 A1 | 3/2021 | Otsubo et al. | |
| 2021/0193588 A1* | 6/2021 | Mescher | H01L 23/552 |
| 2024/0203901 A1* | 6/2024 | Ohda | H01L 23/3121 |

FOREIGN PATENT DOCUMENTS

| | | |
|---|---|---|
| WO | 2018/101383 A1 | 6/2018 |
| WO | 2018/164158 A1 | 9/2018 |
| WO | 2019/156051 A1 | 8/2019 |
| WO | 2019/230705 A1 | 12/2019 |

* cited by examiner

MODULE

CROSS REFERENCE TO RELATED APPLICATION

This is a continuation of International Application No. PCT/JP2021/021339 filed on Jun. 4, 2021 which claims priority from Japanese Patent Application No. 2020-103943 filed on Jun. 16, 2020. The contents of these applications are incorporated herein by reference in their entireties.

BACKGROUND OF THE DISCLOSURE

Field of the Disclosure

The present disclosure relates to a module.

Description of the Related Art

Japanese Patent Laying-Open No. 2002-334954 (PTL 1) discloses a configuration of an electronic device. The electronic device includes an electronic component mounted on a surface of a mounting substrate, a resin film that covers the electronic component and the mounting substrate and is bonded to the mounting substrate, and a conductive film that covers the resin film. The resin film is in close contact with surfaces of the electronic component and the mounting substrate.

The mounting substrate is provided with a grounding conductor portion. The resin film is provided with a hole at a position corresponding to the grounding conductor portion. The conductive film is electrically connected to the grounding conductor portion through the hole.

PTL 1: Japanese Patent Laid-Open No. 2002-334954

BRIEF SUMMARY OF THE DISCLOSURE

In the configuration described in PTL 1, the conductive film that covers the resin film is connected to the grounding conductor portion through the hole provided in the resin film. This hole is formed with a cutter having a shape such as a conical shape, a pyramid shape, and a wedge shape, and the conductive film is formed by sputtering to be deposited on a surface of the resin film and inside the hole. When the conductive film is formed in this manner, the conductive film may fail to be formed to reach the grounding conductor portion through the hole. Therefore, electrical connection of the conductive film to the grounding conductor portion has been uncertain.

Accordingly, a possible benefit of the present disclosure is to provide a module which adopts a structure of covering a component mounted on a substrate with a two-layer structure including a resin film and a conductive film, in a close contact manner, and in which the conductive film is reliably electrically connected to an electrode provided on the substrate.

In order to achieve the possible benefit described above, a module based on the present disclosure includes: a substrate having a first surface; a first component mounted on the first surface; a resin film that covers the first component along a shape of the first component, and also covers a part of the first surface; a first conductor film that covers at least a part of the resin film along the shape of the first component, and covers at least a part of a portion in which the resin film covers the part of the first surface; and a conductor structure disposed to extend over a part of the resin film at a location where the first conductor film covers the first surface with the resin film being interposed therebetween. The conductor structure includes a first end portion, a second end portion, and an intermediate portion connecting the first end portion and the second end portion. The first end portion is connected to the first surface. The second end portion is also connected to the first surface. The intermediate portion is in contact with the first conductor film.

According to the present disclosure, it is possible to provide a module which adopts a structure of covering a component mounted on a substrate with a two-layer structure including a resin film and a conductive film, in a close contact manner, and in which the conductive film is reliably electrically connected to an electrode provided on the substrate.

DETAILED DESCRIPTION OF THE DISCLOSURE

Figure 1:
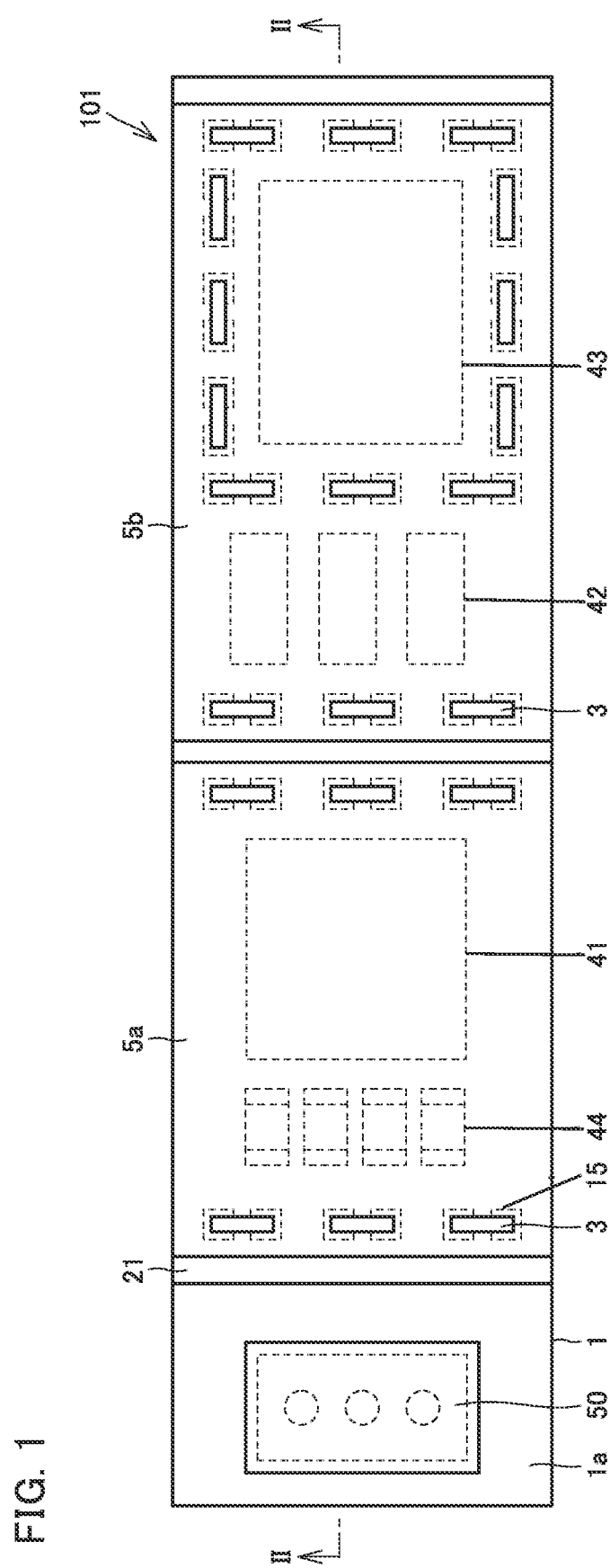
FIG. 1 is a plan view of a module in a first embodiment based on the present disclosure.

The dimensional ratios shown in the drawings do not necessarily represent actual dimensional ratios faithfully, and may be exaggerated for convenience of explanation. In the description below, mentioning the concept of "upper" or "lower" does not necessarily indicate an absolute upper or lower position, but may indicate a relatively upper or lower position in a posture shown.

First Embodiment

Figure 2:
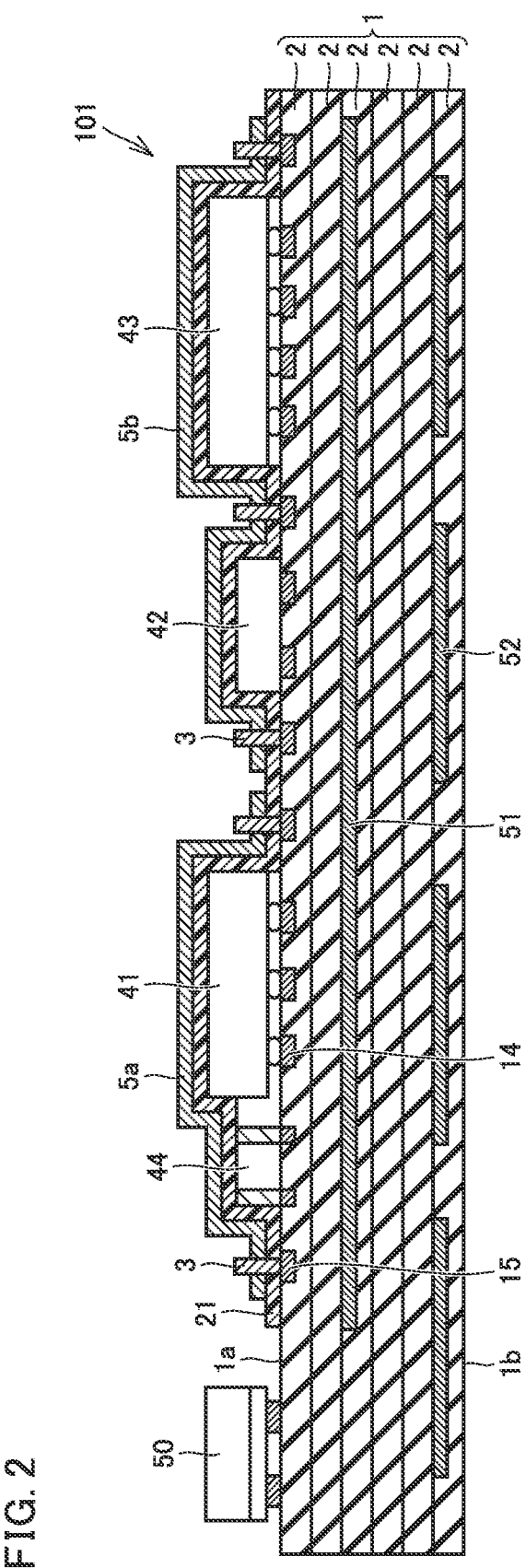
FIG. 2 is a cross sectional view taken along a line II-II in FIG. 1 and viewed in the direction of arrows.
Figure 3:
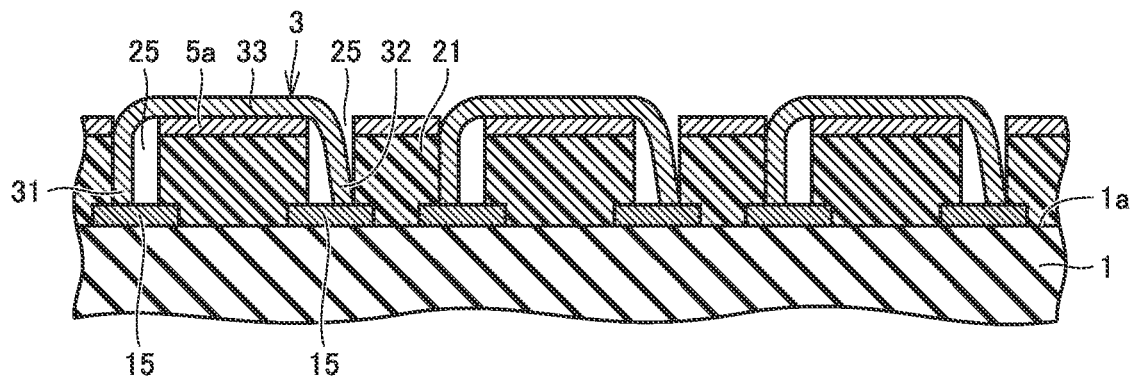
FIG. 3 is an enlarged cross sectional view of a conductor structure and its vicinity included in the module in the first embodiment based on the present disclosure.

Referring to FIGS. 1 to 3, a module in a first embodiment based on the present disclosure will be described. FIG. 1 shows a plan view of the module in the present embodiment. FIG. 2 shows a cross sectional view taken along a line II-II in FIG. 1 and viewed in the direction of arrows. A module 101 in the present embodiment is an antenna module.

Module 101 in the present embodiment includes a substrate 1 having a first surface 1a, a first component 41 mounted on first surface 1a, a resin film 21, a first conductor film 5a, and a conductor structure 3. Resin film 21 covers first component 41 along a shape of first component 41, and also covers a part of first surface 1a. First conductor film 5a covers at least a part of resin film 21 along the shape of first component 41, and covers at least a part of a portion in which resin film 21 covers the part of first surface 1a. Conductor structure 3 is disposed to extend over a part of resin film 21 at a location where first conductor film 5a covers first surface 1a with resin film 21 being interposed therebetween.

FIG. 3 shows an enlarged view of conductor structure 3 and its vicinity. It is to be noted that FIG. 3 shows an enlarged view of a cross section taken in a direction 90° different from that for the cross section shown in FIG. 2. That is, the right-left direction in FIG. 3 corresponds to the front-back direction in the paper plane in FIG. 2. Here, an example where conductor structure 3 is a wire is shown. The wire is arranged by wire bonding to connect two ground electrodes 15 provided on first surface 1a of substrate 1. Conductor structure 3 includes a first end portion 31, a second end portion 32, and an intermediate portion 33 connecting first end portion 31 and second end portion 32. First end portion 31 is connected to first surface 1a. Second end portion 32 is also connected to first surface 1a. The expression "being connected to first surface 1a" used herein has a meaning including being connected to an electrode provided on first surface 1a. Specifically, first end portion 31 and second end portion 32 are respectively connected to separate ground electrodes 15. Intermediate portion 33 is in contact with first conductor film 5a. Intermediate portion 33 and first conductor film 5a in contact with each other are in a state where they are electrically connected. Intermediate portion 33 is disposed to extend over first conductor film 5a. That is, intermediate portion 33 passes on a side farther than first conductor film 5a, when viewed from first surface 1a.

Substrate 1 has a second surface 1b as a surface opposite to first surface 1a. Substrate 1 illustrated herein is a multi-layer substrate as shown in FIG. 2. Substrate 1 includes a plurality of insulating layers 2. A patch antenna 52 is disposed inside substrate 1, at a position close to second surface 1b. A ground conductor pattern 51 is disposed inside substrate 1, at a position closer to first surface 1a than patch antenna 52.

In addition to first component 41, components 42, 43, and 44 are also mounted on first surface 1a. First surface 1a is provided with several pad electrodes 14, and first component 41 and components 42, 43, and 44 are respectively mounted via pad electrodes 14. First component 41 may be an IC (Integrated Circuit), for example. First component 41 may be an LNA (Low Noise Amplifier), for example. A connector 50 is also mounted on first surface 1a. Connector 50 is not covered with resin film 21. Component 44 is covered with first conductor film 5a with resin film 21 being interposed therebetween, as with first component 41.

Components 42 and 43 are also covered with resin film 21. A second conductor film 5b is provided to cover components 42 and 43 with resin film 21 being interposed therebetween. First conductor film 5a and second conductor film 5b may be made of the same material, and may be formed at the same time by the same step. First conductor film 5a and second conductor film 5b are spaced from each other. Therefore, first conductor film 5a and second conductor film 5b are electrically independent of each other. The wire as conductor structure 3 is also provided between component 42 and component 43.

According to the present embodiment, since there exists first conductor film 5a that covers first component 41 along the shape of first component 41 with resin film 21 being interposed therebetween, first conductor film 5a can act as a shield film at a position extremely close to first component 41. Further, since intermediate portion 33 of conductor structure 3 in a shape in which both the end portions are connected to first surface 1a is in contact with first conductor film 5a, connection for grounding first conductor film 5a can be ensured via conductor structure 3.

Therefore, according to the present embodiment, it is possible to provide a module which adopts a structure of covering a component mounted on a substrate with a two-layer structure including a resin film and a conductive film, in a close contact manner, and in which the conductive film is reliably electrically connected to an electrode provided on the substrate.

Further, in the present embodiment, since conductor structure 3 is disposed to extend over a part of resin film 21, it is possible to make peeling of resin film 21 less likely to occur.

In the present embodiment, since first conductor film 5a that can act as a shield film for first component 41 exists at the position extremely close to first component 41, the occupied volume of module 101 as a whole can be suppressed to be small.

As shown in the present embodiment, conductor structure 3 is preferably a wire. By adopting this configuration, conductor structure 3 can be easily implemented.

As shown in the present embodiment, the module preferably includes an antenna. By including an antenna, the module can exchange a signal as an antenna module. As shown in the present embodiment, preferably, substrate 1 has second surface 1b as a surface opposite to first surface 1a, and the antenna is disposed inside substrate 1 along second surface 1b.

In the present embodiment, since the wire as conductor structure 3 is also provided between component 42 and component 43, noise interference between these components 42 and 43 can be suppressed.

(Manufacturing Method)

Referring to FIGS. 4 to 7, a manufacturing method for obtaining module 101 in the present embodiment will be described. Here, the description will be continued with only a partial range being shown, for convenience of explanation.

Figure 4:
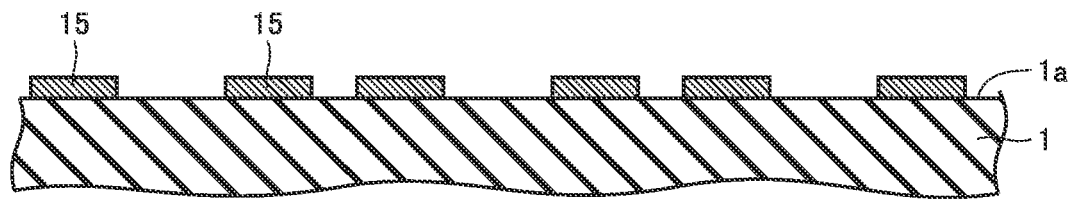
FIG. 4 is an explanatory view of a first step of a method for manufacturing the module in the first embodiment based on the present disclosure.

First, as shown in FIG. 4, substrate 1 having first surface 1a is prepared. First surface 1a of substrate 1 is provided with ground electrodes 15. Ground electrodes 15 can be formed, for example, by forming a conductor film to cover entire first surface 1a, and then patterning the conductor film.

Figure 5:
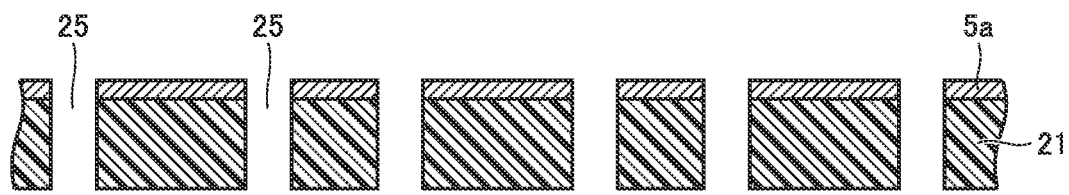
FIG. 5 is an explanatory view of a second step of the method for manufacturing the module in the first embodiment based on the present disclosure.

On the other hand, as shown in FIG. 5, resin film 21 is prepared. At this point of time, resin film 21 is a sheet-like film. One surface of resin film 21 is covered with first conductor film 5a. Openings 25 are provided to penetrate resin film 21 and first conductor film 5a collectively. Openings 25 can be formed, for example, by laser processing. Alternatively, the openings may be formed by removing desired regions of first conductor film 5a by etching, and thereafter performing laser processing on resin film 21.

Figure 6:
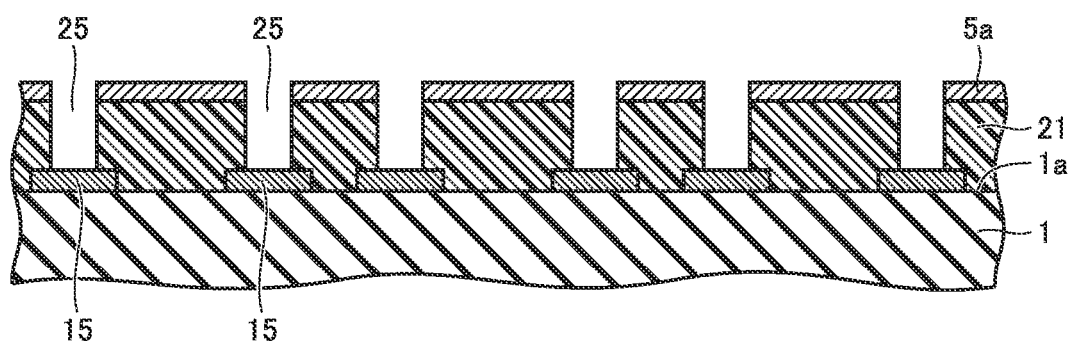
FIG. 6 is an explanatory view of a third step of the method for manufacturing the module in the first embodiment based on the present disclosure.

Resin film 21 shown in FIG. 5 is affixed to substrate 1 shown in FIG. 4. Actually, sheet-like resin film 21 is placed over first component 41, and is heated and pressurized, and thereby resin film 21 is deformed. Resin film 21 sticks to first component 41 to come into close contact with first component 41, and at the same time also comes into close contact with first surface 1a. Thus, in a partial region, resin film 21 is in close contact with substrate 1, as shown in FIG. 6.

Figure 7:
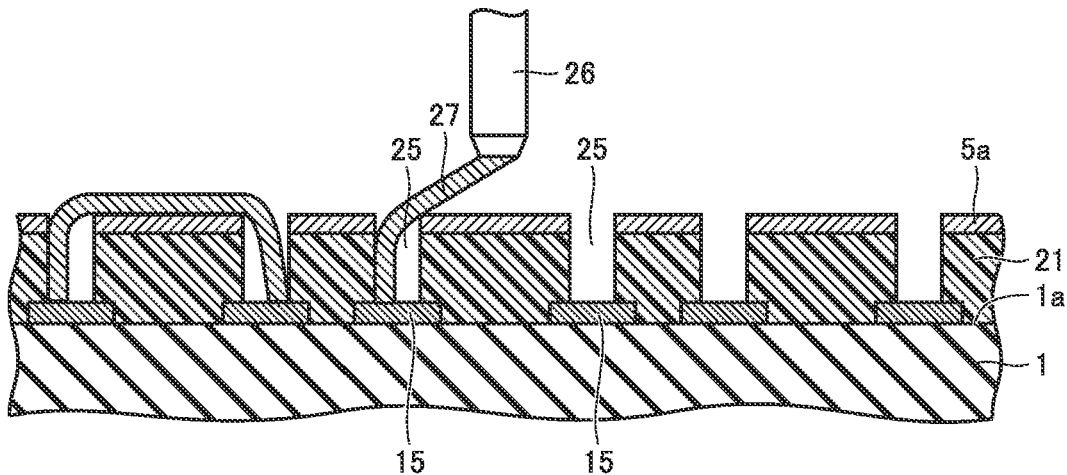
FIG. 7 is an explanatory view of a fourth step of the method for manufacturing the module in the first embodiment based on the present disclosure.

As shown in FIG. 7, wire bonding is performed. A wire is supplied from a head 26 of a wire bonder. The central part of FIG. 7 shows a state where the first bonding has been already performed. That is, an end portion of the wire is already connected to one ground electrode 15. Head 26 is moving toward another ground electrode 15, while drawing the wire. Thereafter, the second bonding is performed and the wire is detached from head 26, and thereby the structure shown in FIG. 3 is obtained. That is, conductor structure 3 is disposed to connect between two ground electrodes 15 provided on first surface 1a of substrate 1. Intermediate portion 33 of conductor structure 3 is in contact with first conductor film 5a. Thereby, conductor structure 3 and first conductor film 5a are electrically connected. The contents of the description provided for first conductor film 5a also apply to second conductor film 5b.

Although the first embodiment has been described based on an example where conductor structure 3 is a wire, the conductor structure is not limited to a wire.

Second Embodiment

Figure 8:
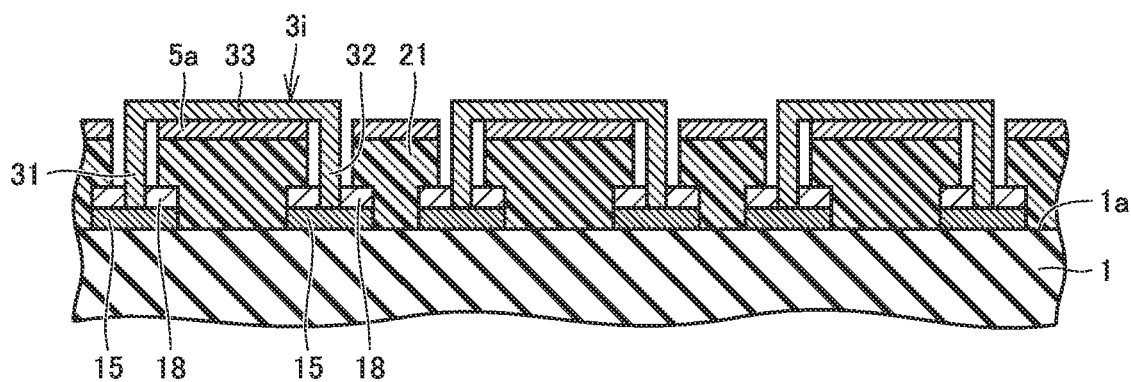
FIG. 8 is an enlarged partial cross sectional view of a module in a second embodiment based on the present disclosure.

Referring to FIG. 8, a module in a second embodiment based on the present disclosure will be described. Although this module has the same basic configuration as that of module 101 described in the first embodiment, it has a different conductor structure. Thus, FIG. 8 shows an enlarged view of a conductor structure and its vicinity of the module in the present embodiment. In the present embodiment, a conductor structure 3i as shown in FIG. 8 is used instead of conductor structure 3 shown in FIG. 3. Conductor structure 3i is a metal pin having a shape in which it is bent substantially at a right angle at two intermediate positions. Conductor structure 3i has this shape before it is connected to first surface 1a of substrate 1. Solder 18 is placed on ground electrodes 15 provided on first surface 1a. Solder 18 may be obtained by solidifying solder paste. First end portion 31 and second end portion 32 of conductor structure 3i are respectively connected with ground electrodes 15 via solder 18.

Also in the present embodiment, the effect as described in the first embodiment can be achieved. Since conductor structure 3i, which is a metal pin, has a more stable shape when compared with conductor structure 3, which is a wire, it can be expected to be easily disposed even in a narrow region. Openings 25 for connecting conductor structure 3i to ground electrodes 15 may have a smaller size, which can save space.

As shown in the present embodiment, conductor structure 3 is preferably a metal pin.

(Manufacturing Method)

Referring to FIGS. 9 to 12, a manufacturing method for obtaining the module in the present embodiment will be described. Here, the description will be continued with only a partial range being shown, for convenience of explanation.

Figure 9:
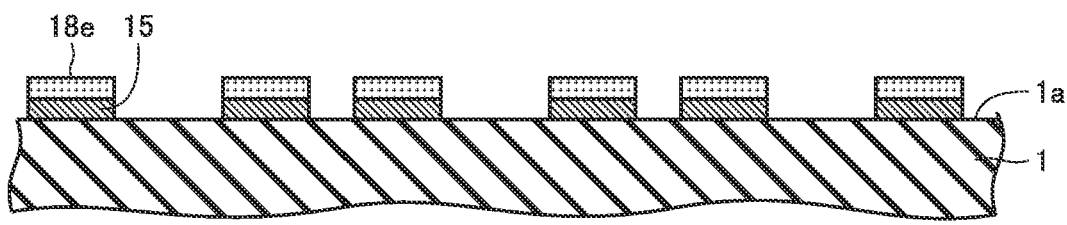
FIG. 9 is an explanatory view of a first step of a method for manufacturing the module in the second embodiment based on the present disclosure.

First, as shown in FIG. 9, substrate 1 having first surface 1a is prepared. First surface 1a of substrate 1 is provided with ground electrodes 15, and solder paste 18e is applied to ground electrodes 15. Resin film 21 as shown in FIG. 5 is prepared separately.

Resin film 21 shown in FIG. 5 is affixed to substrate 1 shown in FIG. 9. Actually, sheet-like resin film 21 is placed over first component 41, and is heated and pressurized, and thereby resin film 21 is deformed. Resin film 21 sticks to first component 41 to come into close contact with first component 41, and at the same time also comes into close contact with first surface 1a. Thus, in a partial region, resin film 21 is in close contact with substrate 1, as shown in FIG. 10.

Figure 11:
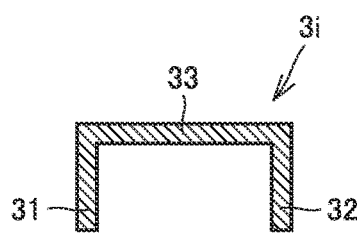
FIG. 11 is a front view of a conductor structure included in the module in the second embodiment based on the present disclosure.
Figure 12:
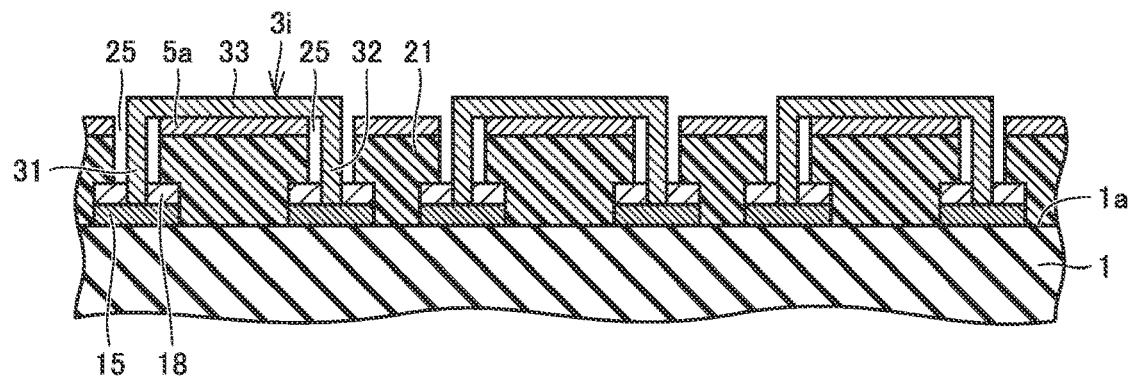
FIG. 12 is an explanatory view of a third step of the method for manufacturing the module in the second embodiment based on the present disclosure.

Conductor structure 3i as shown in FIG. 11 is prepared. Conductor structure 3i may be a metal pin processed beforehand into a shape as shown herein. Conductor structure 3i is connected to substrate 1. First end portion 31 and second end portion 32 of conductor structure 3i pass through openings 25 and come into contact with solder paste 18e placed on ground electrodes 15. By performing reflow, solder paste 18e electrically connects conductor structure 3i and ground electrodes 15, as solder 18, as shown in FIG. 12.

Figure 10:
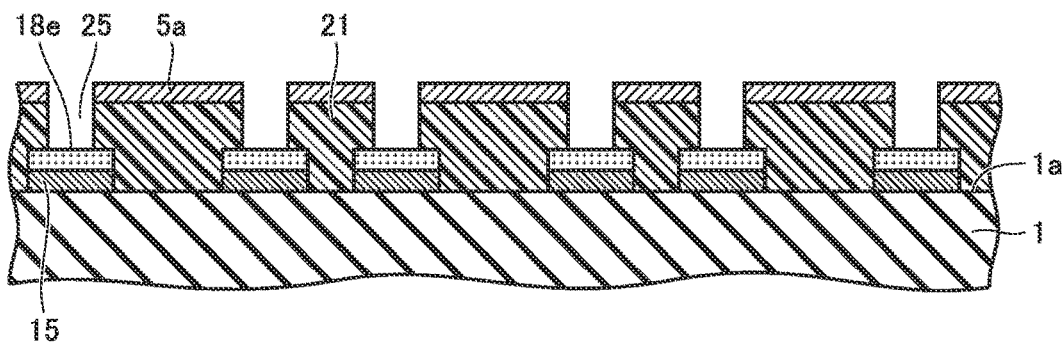
FIG. 10 is an explanatory view of a second step of the method for manufacturing the module in the second embodiment based on the present disclosure.
Figure 13:
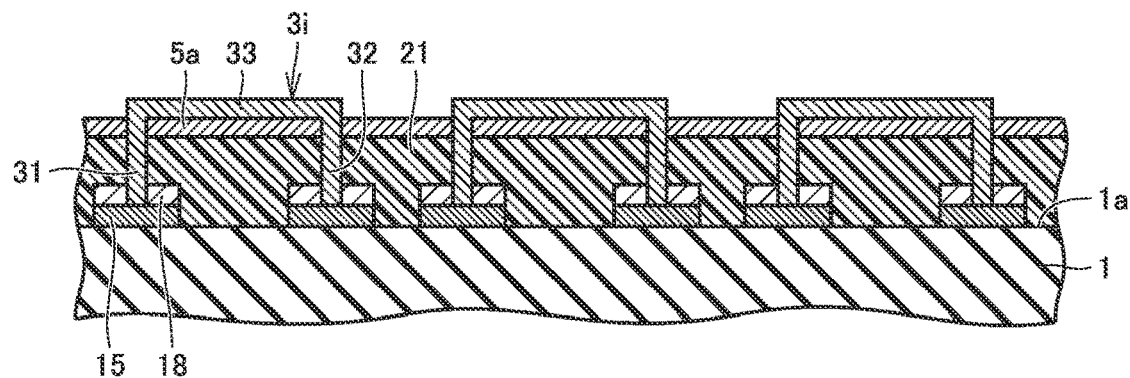
FIG. 13 is an enlarged partial cross sectional view of a variation of the module in the second embodiment based on the present disclosure.

Although an example in which openings 25 are provided in resin film 21 as shown in FIG. 10 is shown herein, when conductor structure 3i, which is a metal pin, is used, gaps do not have to be provided around first end portion 31 and second end portion 32 of conductor structure 3*i*. FIG. 13 shows an example in this case. When conductor structure 3*i* has a certain degree of rigidity, it is also possible to cause conductor structure 3*i* to penetrate resin film 21 by pressing conductor structure 3*i* into resin film 21. In the example shown in FIG. 13, there is no gap around first end portion 31 and second end portion 32, and resin film 21 is in contact with conductor structure 3*i*.

Third Embodiment

Figure 14:
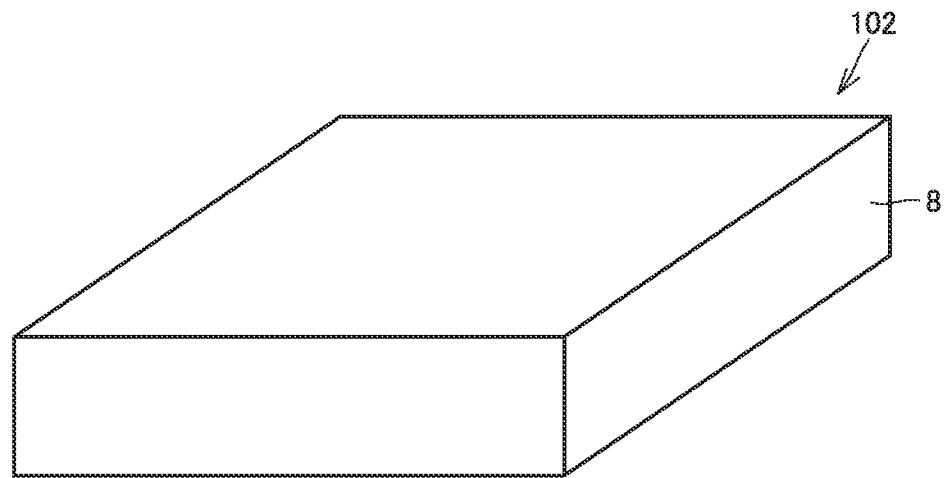
FIG. 14 is a first perspective view of a module in a third embodiment based on the present disclosure.
Figure 15:
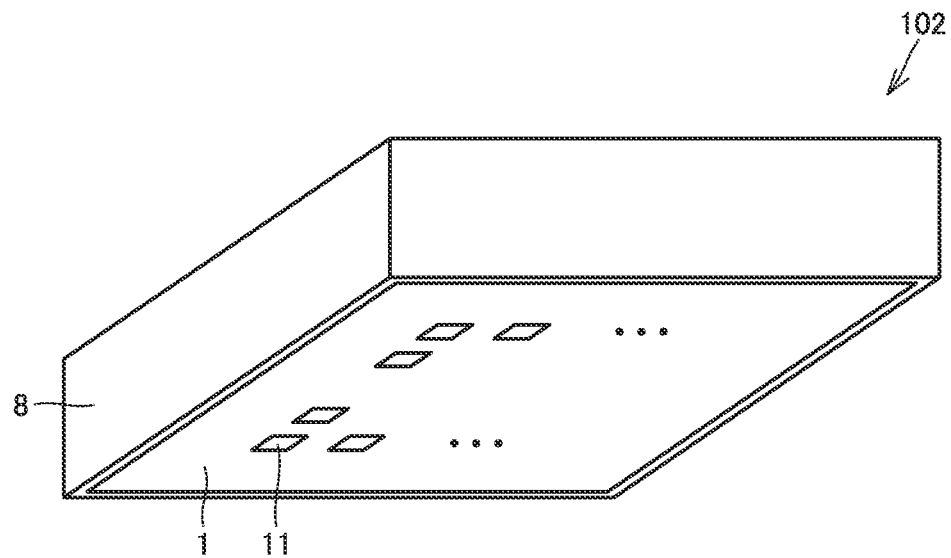
FIG. 15 is a second perspective view of the module in the third embodiment based on the present disclosure.
Figure 16:
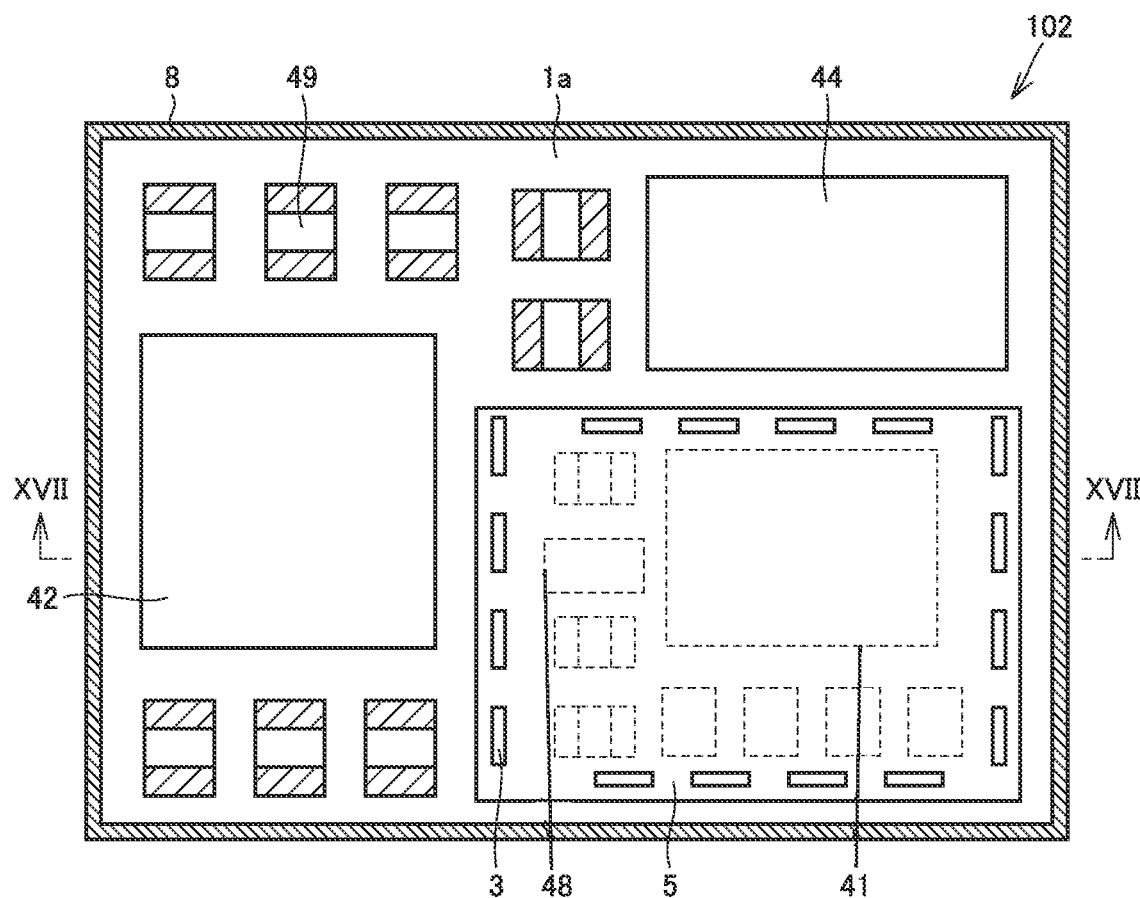
FIG. 16 is a perspective plan view of the module in the third embodiment based on the present disclosure.
Figure 17:
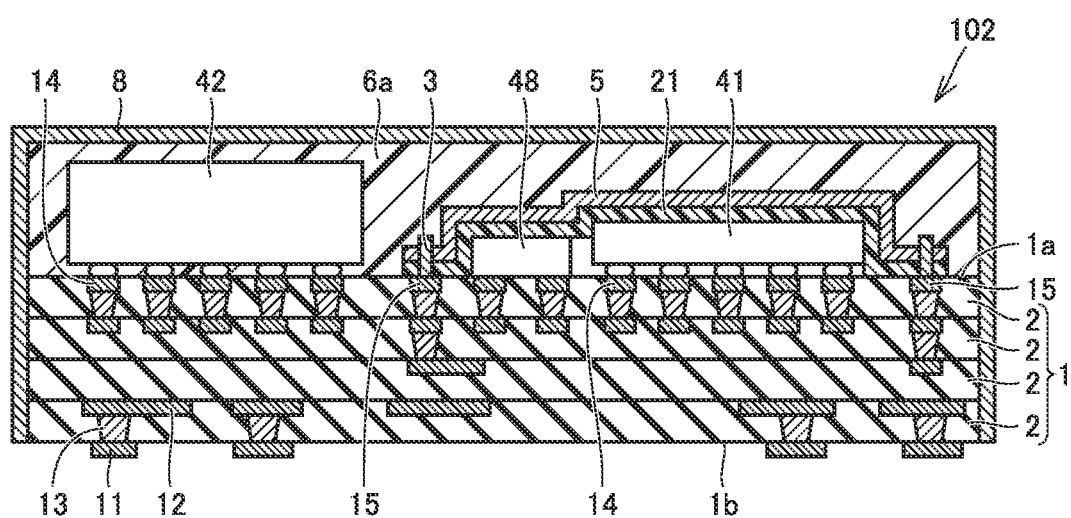
FIG. 17 is a cross sectional view taken along a line XVII-XVII in FIG. 16 and viewed in the direction of arrows.

Referring to FIGS. 14 to 17, a module in a third embodiment based on the present disclosure will be described. FIG. 14 shows an external appearance of a module 102 in the present embodiment. An upper surface and side surfaces of module 102 are covered with a shield film 8. FIG. 15 shows module 102 viewed obliquely from below in FIG. 14. A lower surface of module 102 is not covered with shield film 8, and substrate 1 is exposed. A lower surface of substrate 1 is provided with one or more external electrodes 11. The number, the size, and the arrangement of external electrodes 11 shown in FIG. 15 are merely by way of example. FIG. 16 shows a perspective plan view of module 102. FIG. 16 corresponds to a top view of module 102 from which an upper surface of shield film 8 has been removed and a first sealing resin 6*a* has also been removed. FIG. 17 shows a cross sectional view taken along a line XVII-XVII in FIG. 16 and viewed in the direction of arrows. FIG. 17 also shows first sealing resin 6*a* and the like as they are present.

Module 102 includes substrate 1. Substrate 1 has first surface 1*a* and second surface 1*b*. Substrate 1 may include wiring on a surface thereof or inside thereof. Substrate 1 may be a resin substrate, or may be a ceramic substrate. Substrate 1 may be a multilayer substrate. That is, substrate 1 may be a resin multilayer substrate, or may be a ceramic multilayer substrate.

Substrate 1 has second surface 1*b* as a surface opposite to first surface 1*a*. Substrate 1 illustrated herein is a multilayer substrate. Substrate 1 includes the plurality of insulating layers 2. The plurality of external electrodes 11 are disposed on second surface 1*b* of substrate 1. A conductor pattern 12 and conductor vias 13 are disposed as appropriate inside substrate 1. Pad electrodes 14 are disposed in first surface 1*a* of substrate 1. In addition to first component 41, for example, components 42, 48, and 49 are also mounted on first surface 1*a*. These components are mounted via pad electrodes 14 in first surface 1*a*.

Resin film 21 is disposed to collectively cover first component 41 and the several other components. Resin film 21 covers first component 41 along the shape of first component 41. A first conductor film 5 is disposed to cover resin film 21. First conductor film 5 covers at least a part of resin film 21 along the shape of first component 41, and covers at least a part of a portion in which resin film 21 covers the part of first surface 1*a*. Conductor structure 3 is disposed to extend over a part of resin film 21 at a location where first conductor film 5 covers first surface 1*a* with resin film 21 being interposed therebetween. The configuration of conductor structure 3 and its vicinity is the same as that described in the first embodiment. Instead of conductor structure 3, conductor structure 3*i* described in the second embodiment may be adopted. In the present embodiment, component 42 is neither covered with resin film 21 nor with first conductor film 5.

As shown in FIG. 17, first sealing resin 6*a* is disposed to cover first surface 1*a*, first conductor film 5, and resin film 21. Component 42 is also covered with first sealing resin 6*a*. A portion of conductor structure 3 exposed from first conductor film 5 and resin film 21 is also covered with first sealing resin 6*a*. First sealing resin 6*a* may be formed by molding. First sealing resin 6*a* may be obtained by being widely formed on a collective substrate, which corresponds to substrates 1 before being divided, and thereafter being divided into pieces having an individual product size, together with substrates 1. Shield film 8 is disposed to cover an upper surface and side surfaces of first sealing resin 6*a*. Shield film 8 further covers side surfaces of substrate 1. Shield film 8 is a conductive film. Shield film 8 may be formed by sputtering, for example. Shield film 8 may be formed by stacking a plurality of metal films.

In the present embodiment, shielding performance surrounding first component 41 can be enhanced, for the reason as described in the first embodiment. First component 41 is doubly shielded by both first conductor film 5 and shield film 8. Electromagnetic influence between first component 41 and component 42 is shielded by first conductor film 5. In the example shown in FIG. 17, the upper surface of first component 41 is located at a position lower than the upper surface of component 42. When there is a difference in height between components in this manner, if it is attempted to perform shielding using shield film 8 only, concerning first component 41, shield film 8 is located at a position distant from first component 41. However, in the present embodiment, the first shielding can be provided by first conductor film 5 at a position extremely close to first component 41, and thus shielding performance can be enhanced.

Fourth Embodiment

Figure 18:
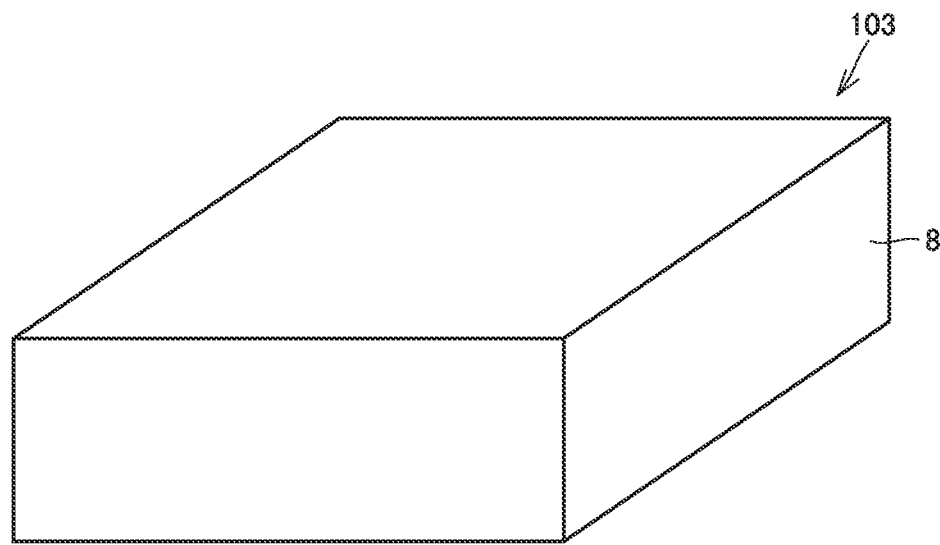
FIG. 18 is a first perspective view of a module in a fourth embodiment based on the present disclosure.
Figure 19:
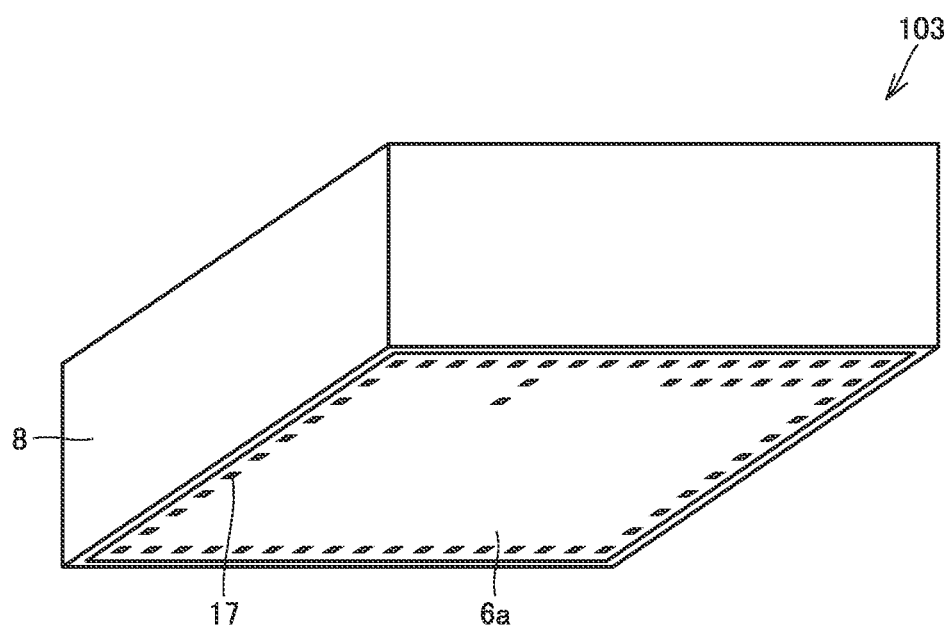
FIG. 19 is a second perspective view of the module in the fourth embodiment based on the present disclosure.

Referring to FIGS. 18 to 21, a module in a fourth embodiment based on the present disclosure will be described. FIG. 18 shows an external appearance of a module 103 in the present embodiment. An upper surface and side surfaces of module 103 are covered with shield film 8. FIG. 19 shows module 103 viewed obliquely from below in FIG. 18. A lower surface of module 103 is not covered with shield film 8, and first sealing resin 6*a* is exposed. One or more external electrodes 17 are exposed in a lower surface of first sealing resin 6*a*.

Figure 20:
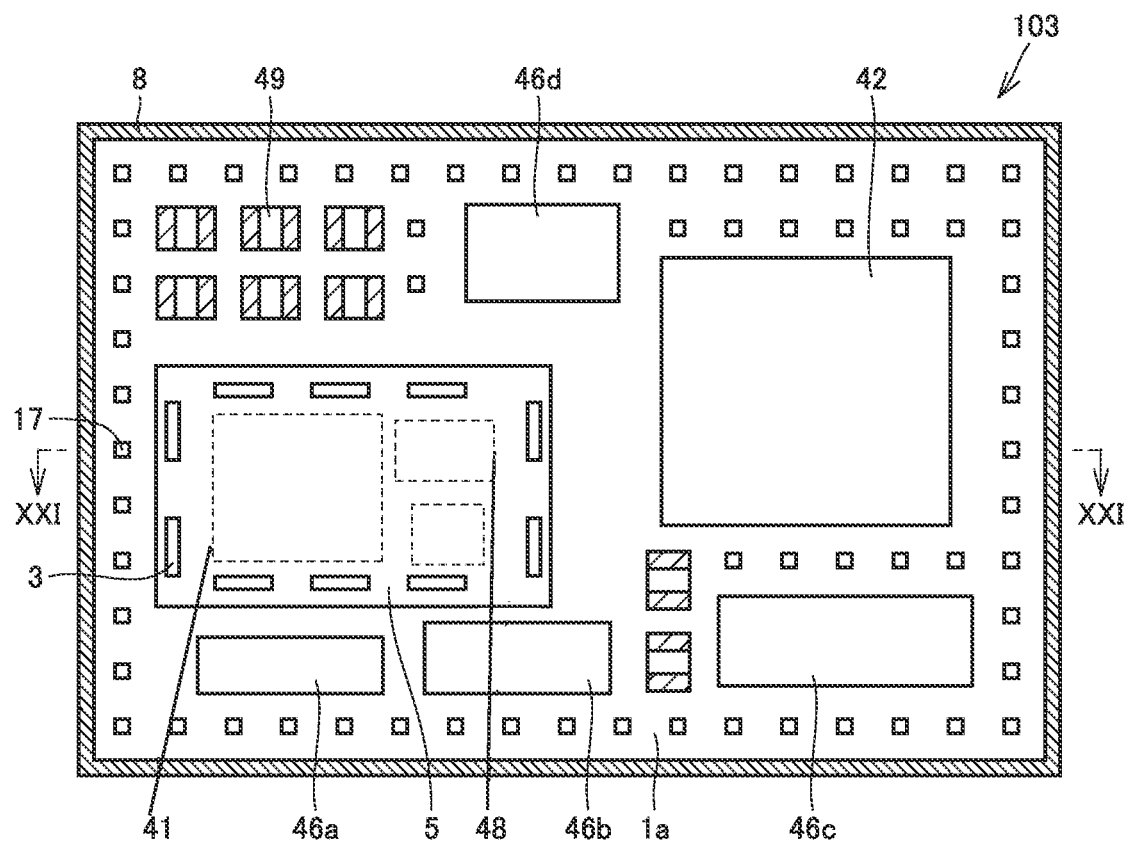
FIG. 20 is a perspective bottom view of the module in the fourth embodiment based on the present disclosure.
Figure 21:
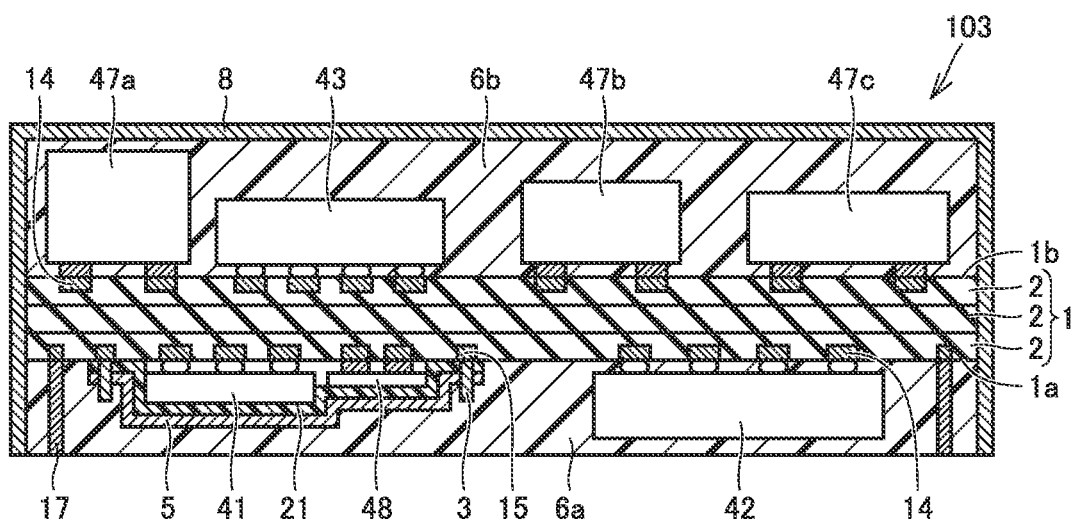
FIG. 21 is a cross sectional view taken along a line XXI-XXI in FIG. 20 and viewed in the direction of arrows.

FIG. 20 shows a perspective bottom view of module 103. That is, FIG. 20 shows module 103 viewed from below, with first sealing resin 6*a* exposed in the lower surface of module 103 being removed. FIG. 21 shows a cross sectional view taken along a line XXI-XXI in FIG. 20 and viewed in the direction of arrows. FIG. 21 also shows first sealing resin 6*a* and the like as they are present. Module 103 includes a double-sided mounting structure.

In the present embodiment, substrate 1 has second surface 1*b* as a surface opposite to first surface 1*a*, and component 43 is mounted on second surface 1*b* as a second component. As shown in FIG. 21, in module 103, a lower surface of substrate 1 is first surface 1*a*, and an upper surface thereof is second surface 1*b*. The expression "second component" used herein means a component mounted on a surface opposite to the first component. A second sealing resin 6*b* is disposed to cover second surface 1*b* and component 43 as the second component.

Also in the present embodiment, shielding performance of the module can be enhanced. Since the double-sided mounting structure is adopted in the present embodiment, more components can be mounted on substrate 1.

In the example shown herein, of the both surfaces of substrate 1, first surface 1a is located closer to a mother substrate or the like when module 103 is mounted on the mother substrate. However, first surface 1a may be located farther from the mother substrate or the like when module 103 is mounted on the mother substrate. In either case, first component 41 is mounted on first surface 1a, resin film 21 and first conductor film 5 cover first component 41, and conductor structure 3 is arranged on first surface 1a.

Fifth Embodiment

Figure 22:
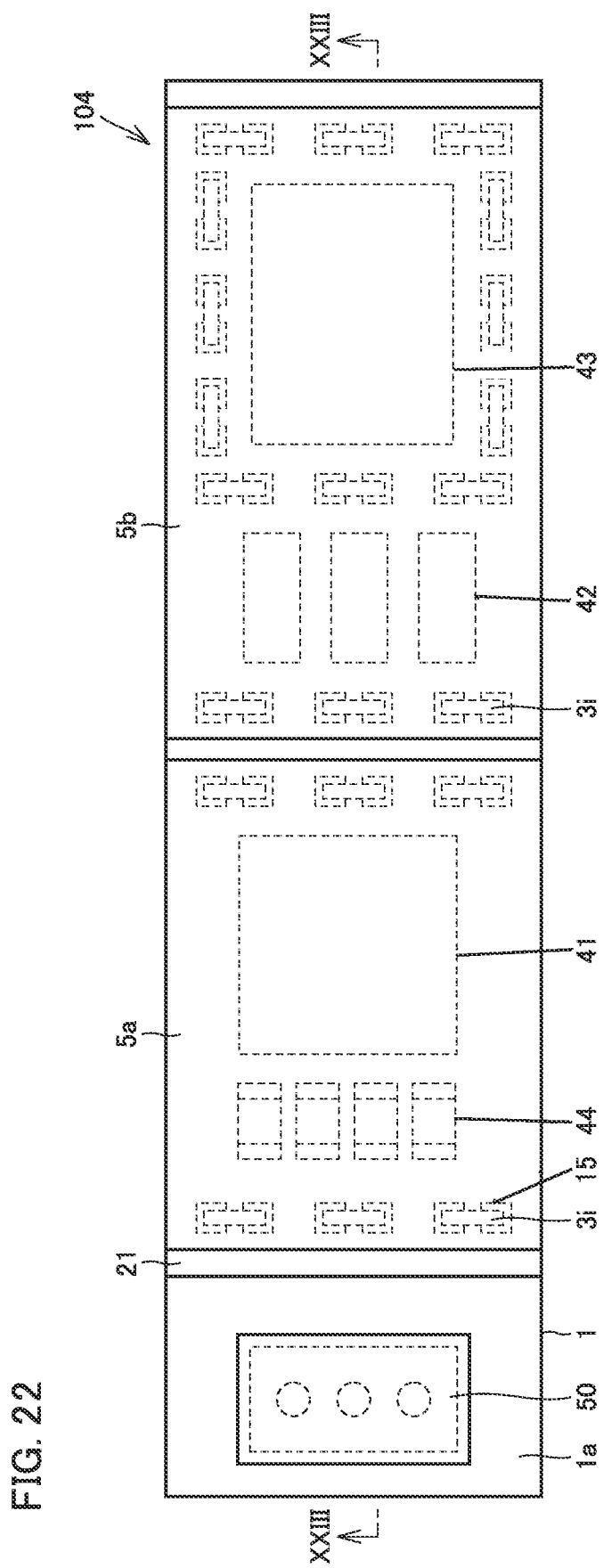
FIG. 22 is a plan view of a module in a fifth embodiment based on the present disclosure.
Figure 23:
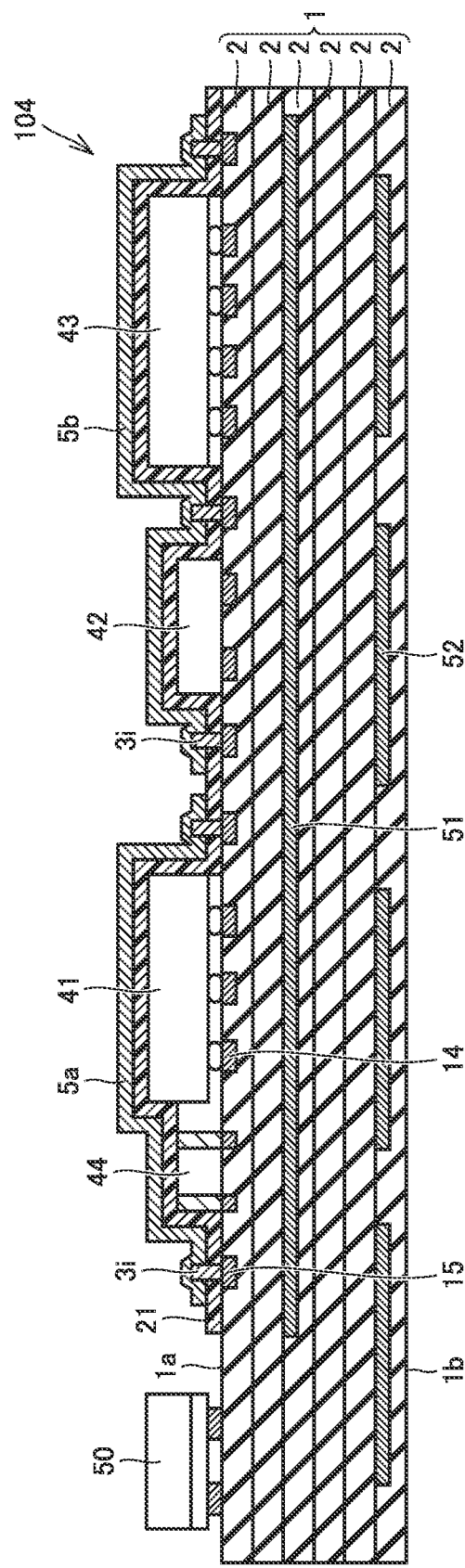
FIG. 23 is a cross sectional view taken along a line XXIII-XXIII in FIG. 22 and viewed in the direction of arrows.
Figure 24:
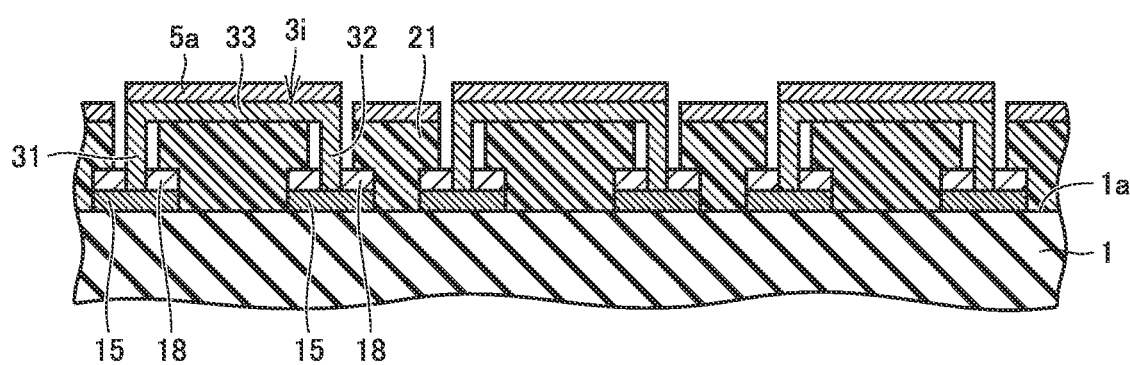
FIG. 24 is an enlarged cross sectional view of a conductor structure and its vicinity included in the module in the fifth embodiment based on the present disclosure.

Referring to FIGS. 22 to 24, a module in a fifth embodiment based on the present disclosure will be described. FIG. 22 shows a plan view of the module in the present embodiment. FIG. 23 is a cross sectional view taken along a line XXIII-XXIII in FIG. 22 and viewed in the direction of arrows. A module 104 in the present embodiment is an antenna module.

Module 104 in the present embodiment includes substrate 1 having first surface 1a, first component 41 mounted on first surface 1a, resin film 21, first conductor film 5a, and conductor structure 3i. Resin film 21 covers first component 41 along the shape of first component 41, and also covers a part of first surface 1a. First conductor film 5a covers at least a part of resin film 21 along the shape of first component 41, and covers at least a part of a portion in which resin film 21 covers the part of first surface 1a. Conductor structure 3i is disposed to extend over a part of resin film 21 at a location where first conductor film 5a covers first surface 1a with resin film 21 being interposed therebetween.

FIG. 24 shows an enlarged view of conductor structure 3i and its vicinity. Conductor structure 3i is arranged to connect two ground electrodes 15 provided on first surface 1a of substrate 1. Conductor structure 3i includes first end portion 31, second end portion 32, and intermediate portion 33 connecting first end portion 31 and second end portion 32. First end portion 31 is connected to first surface 1a. Second end portion 32 is also connected to first surface 1a. Intermediate portion 33 is in contact with first conductor film 5a.

First conductor film 5a covers intermediate portion 33. That is, intermediate portion 33 passes on a side closer than first conductor film 5a, when viewed from first surface 1a. Although first conductor film 5a located above intermediate portion 33 of conductor structure 3i and first conductor film 5a located in a region with no conductor structure 3i appear to be separated and spaced in FIG. 24, they merely appear so in this cross section. Considering the spread in the front-back direction in the paper plane in FIG. 24, first conductor films 5a which appear to be separated in FIG. 24 are all connected and electrically integral. Both ends of conductor structure 3i are connected to ground electrodes 15 via solder 18.

The structure in the present embodiment can be obtained by arranging conductor structure 3i in a state where first conductor film 5a has not been formed yet, then covering, with a mask or the like, a region in which first conductor film 5a should not be formed, and thereafter performing sputtering or the like. When sputtering is performed in such an order, first conductor film 5a is formed to cover intermediate portion 33 of conductor structure 3i.

The contents of the description provided for first conductor film 5a also apply to second conductor film 5b.

Also in the present embodiment, the same effect as that in the first embodiment can be achieved. Further, in the present embodiment, since first conductor film 5a covers intermediate portion 33 of conductor structure 3i, electrical connection between conductor structure 3i and first conductor film 5a can be ensured. Furthermore, it may be possible to make falling off of conductor structure 3i less likely to occur.

Sixth Embodiment

Figure 25:
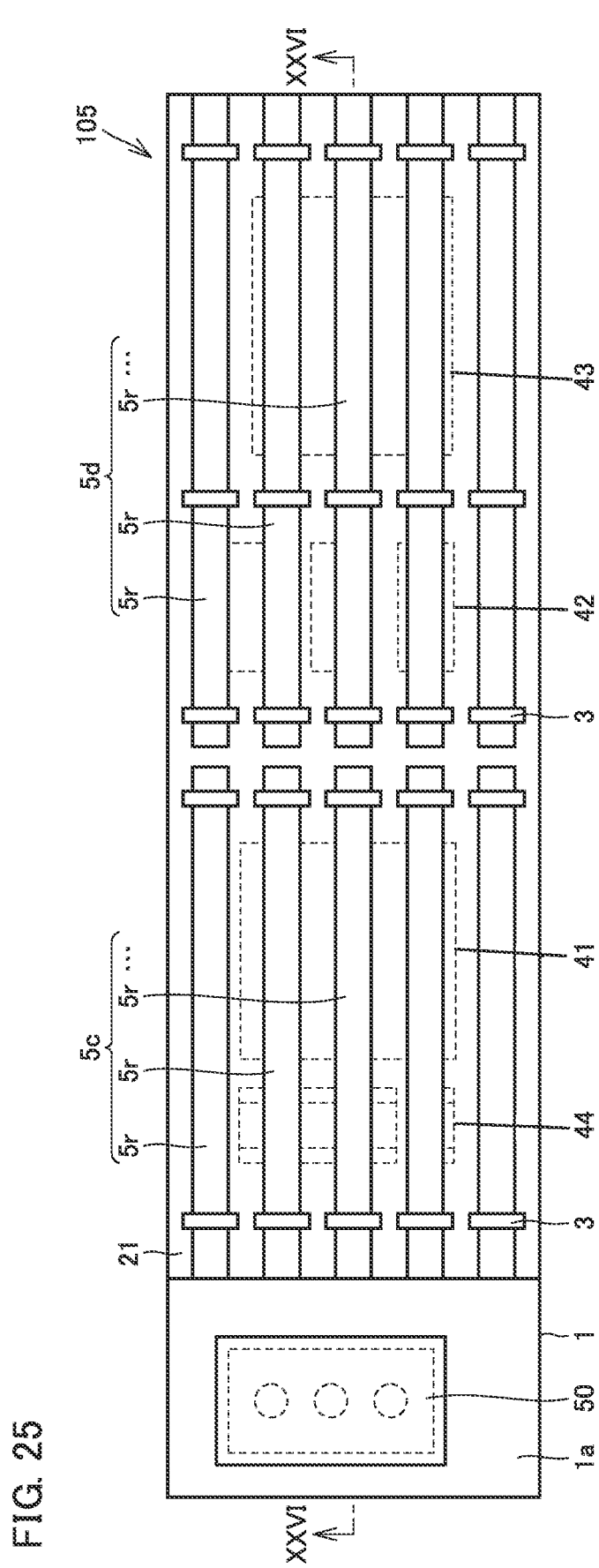
FIG. 25 is a plan view of a module in a sixth embodiment based on the present disclosure.
Figure 26:
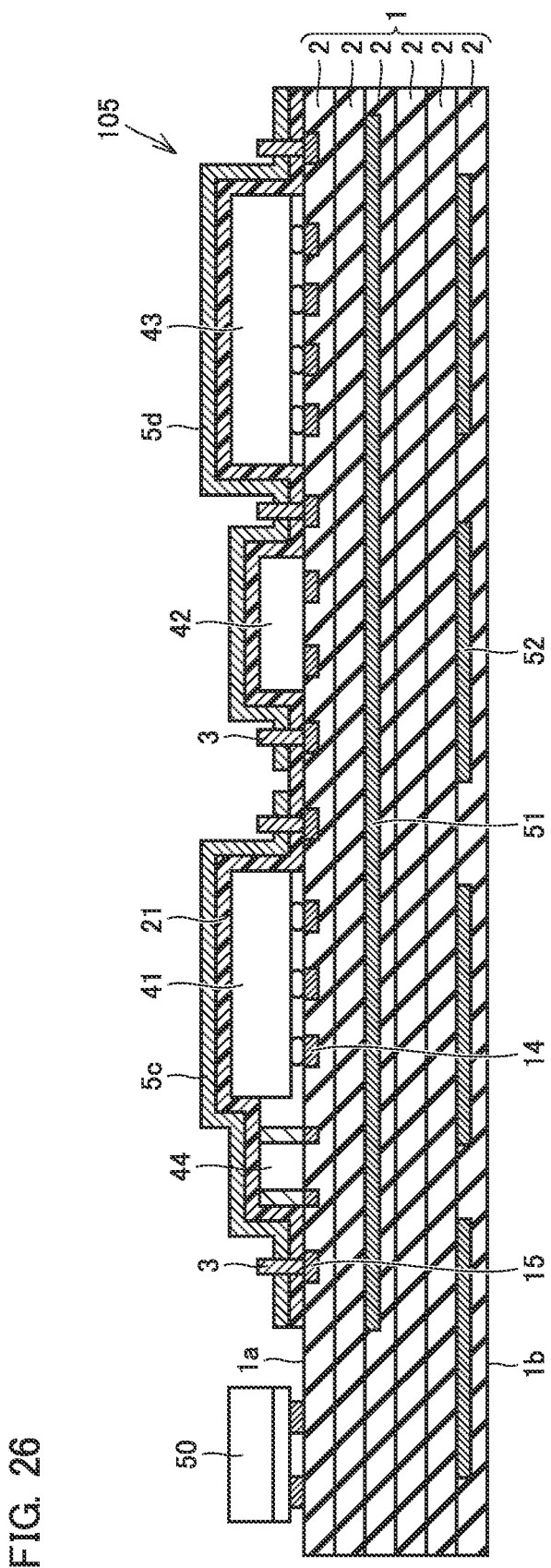
FIG. 26 is a cross sectional view taken along a line XXVI-XXVI in FIG. 25 and viewed in the direction of arrows.
Figure 27:
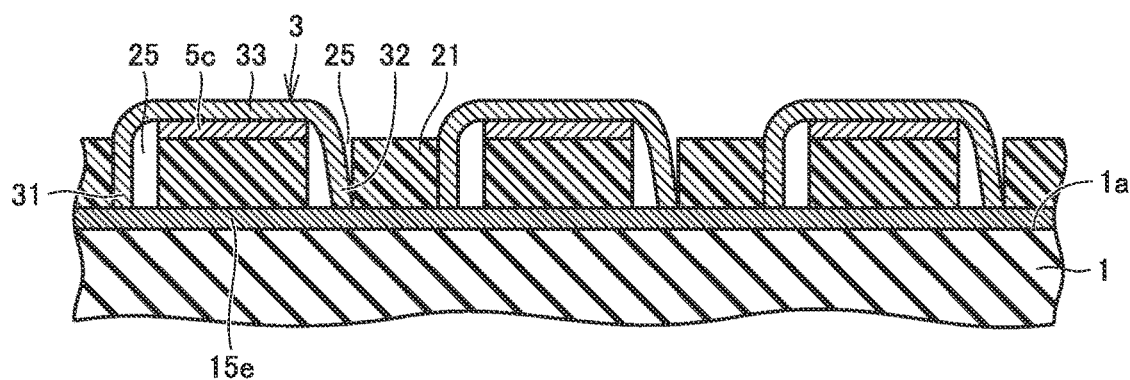
FIG. 27 is an enlarged cross sectional view of a conductor structure and its vicinity included in the module in the sixth embodiment based on the present disclosure.

Referring to FIGS. 25 to 27, a module in a sixth embodiment based on the present disclosure will be described. FIG. 25 shows a plan view of the module in the present embodiment. FIG. 26 is a cross sectional view taken along a line XXVI-XXVI in FIG. 25 and viewed in the direction of arrows. A module 105 in the present embodiment is an antenna module.

In module 105, resin film 21 is disposed to collectively cover several components mounted on first surface 1a of substrate 1. Module 105 includes a first conductor film 5c and a second conductor film 5d. First conductor film 5c and second conductor film 5d are disposed to partially cover an upper surface of resin film 21. In the example shown herein, first conductor film 5c is disposed to cover first component 41 and component 44. Second conductor film 5d is disposed to cover components 42 and 43. First conductor film 5c and second conductor film 5d may be made of the same material, and may be formed at the same time by the same step. First conductor film 5c and second conductor film 5d are spaced from each other. Therefore, first conductor film 5c and second conductor film 5d are electrically independent of each other.

Module 105 includes conductor structure 3. First conductor film 5c includes a plurality of linear portions 5r disposed to be parallel to each other with being spaced from each other, and conductor structure 3 is disposed to extend over at least one of linear portions 5r in a width direction.

FIG. 27 shows an enlarged view of conductor structure 3 and its vicinity. Here, an example where conductor structure 3 is a wire is shown. First surface 1a of substrate 1 is provided with a ground electrode 15e in a longitudinal shape. The wire as conductor structure 3 is arranged by wire bonding to connect two points on ground electrode 15e. Conductor structure 3 includes first end portion 31, second end portion 32, and intermediate portion 33 connecting first end portion 31 and second end portion 32. First end portion 31 is connected to first surface 1a. Second end portion 32 is also connected to first surface 1a. Intermediate portion 33 is in contact with first conductor film 5a. Intermediate portion 33 is disposed to extend over first conductor film 5c. Intermediate portion 33 passes on a side farther than first conductor film 5c, when viewed from first surface 1a. In a region of the upper surface of resin film 21 corresponding to between linear portions 5r, the upper surface of resin film 21 is not covered with first conductor film 5c.

Other than that, the configuration is the same as that of module 101 described in the first embodiment.

Also in the present embodiment, the effect as described in the first embodiment can be achieved. Further, in the present embodiment, since the portion in which first conductor film 5c covers first component 41 has a stripe shape as shown in FIG. 25, it is possible to avoid occurrence of an eddy current due to electromagnetic waves produced when first component 41 is operated.

Seventh Embodiment

Figure 28:
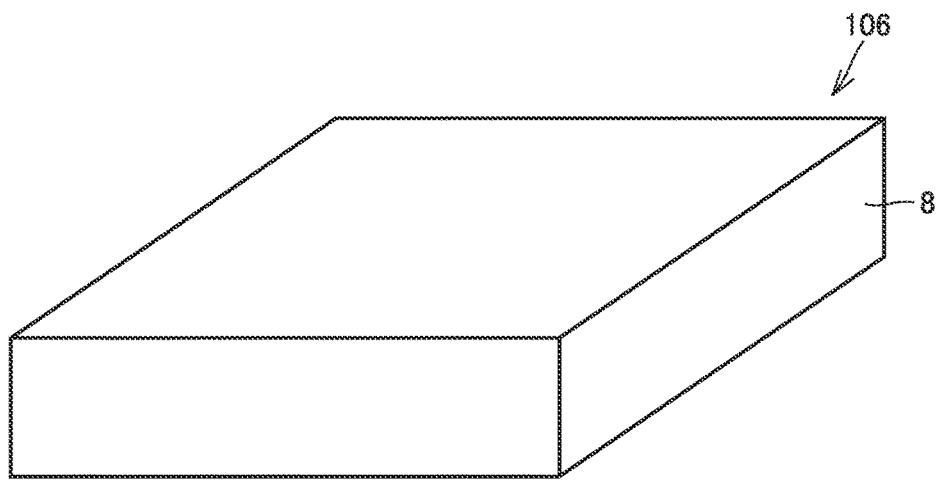
FIG. 28 is a first perspective view of a module in a seventh embodiment based on the present disclosure.
Figure 29:
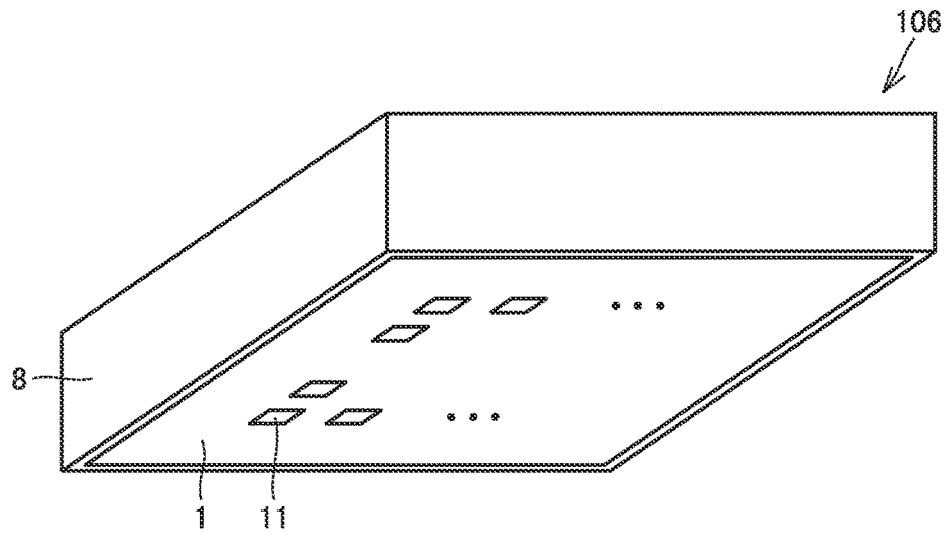
FIG. 29 is a second perspective view of the module in the seventh embodiment based on the present disclosure.
Figure 30:
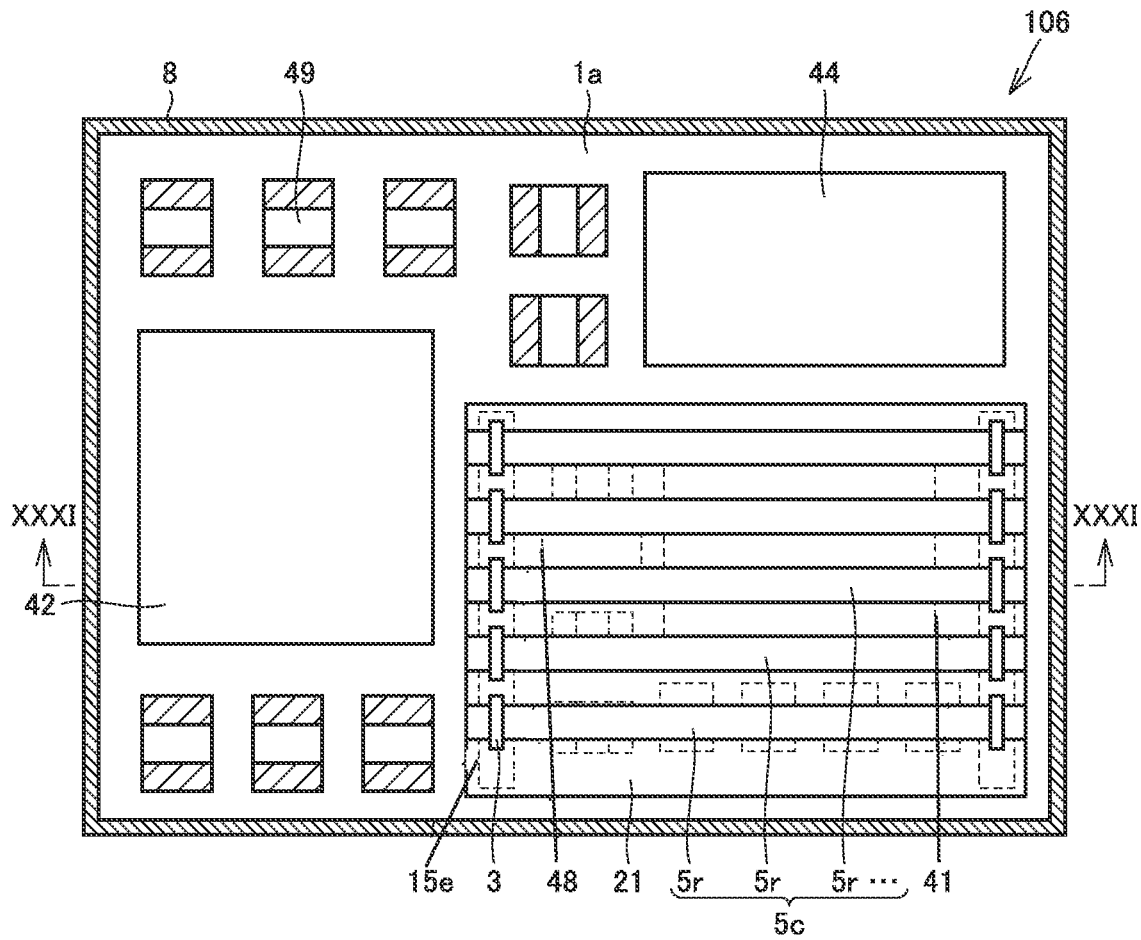
FIG. 30 is a perspective plan view of the module in the seventh embodiment based on the present disclosure.
Figure 31:
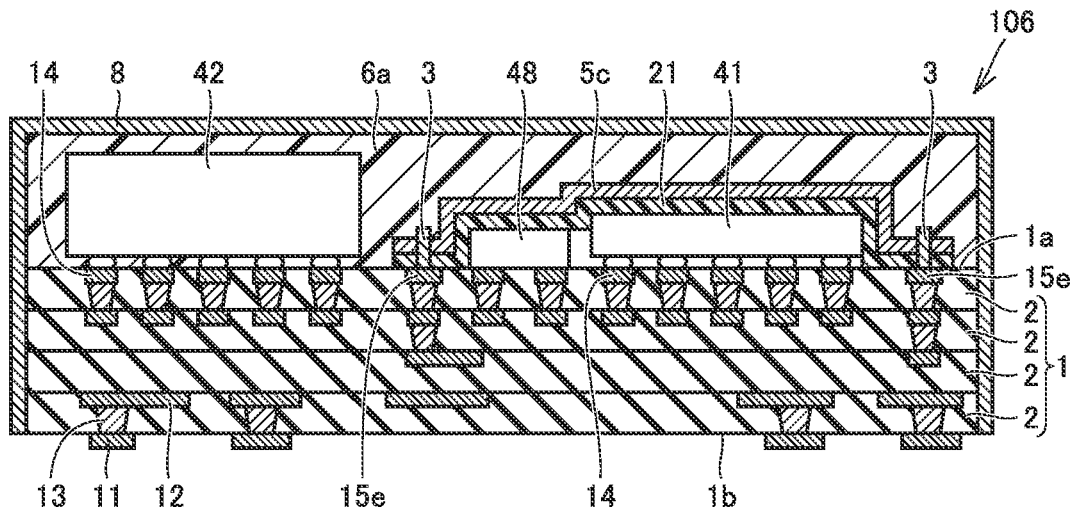
FIG. 31 is a cross sectional view taken along a line XXXI-XXXI in FIG. 30 and viewed in the direction of arrows.

Referring to FIGS. 28 to 31, a module in a seventh embodiment based on the present disclosure will be described. FIG. 28 shows an external appearance of a module 106 in the present embodiment. An upper surface and side surfaces of module 106 are covered with shield film 8. FIG. 29 shows module 106 viewed obliquely from below in FIG. 28. A lower surface of module 106 is not covered with shield film 8, and substrate 1 is exposed. The lower surface of substrate 1 is provided with one or more external electrodes 11. The number, the size, and the arrangement of external electrodes 11 shown in FIG. 29 are merely by way of example. FIG. 30 shows a perspective plan view of module 106. FIG. 30 corresponds to a top view of module 106 from which the upper surface of shield film 8 has been removed and first sealing resin 6a has also been removed. FIG. 31 shows a cross sectional view taken along a line XXXI-XXXI in FIG. 30 and viewed in the direction of arrows. FIG. 31 also shows first sealing resin 6a and the like as they are present.

The basic configuration of module 106 is the same as the configuration of module 102 described in the third embodiment. Module 106 includes first conductor film 5c instead of first conductor film 5. First conductor film 5c includes the plurality of linear portions 5r disposed to be parallel to each other with being spaced from each other, as with those described in the sixth embodiment. Conductor structure 3 is disposed to extend over at least one of linear portions 5r in the width direction. In the present embodiment, first conductor film 5c has a stripe shape.

In the present embodiment, as shown in FIG. 31, first sealing resin 6a is disposed to cover first surface 1a, first conductor film 5c, and resin film 21. Component 42 is also covered with first sealing resin 6a. Shield film 8 is disposed to cover the upper surface and the side surfaces of first sealing resin 6a. The details of first sealing resin 6a and shield film 8 are the same as those described in the third embodiment.

Since resin film 21 is exposed in the region between linear portions 5r, resin film 21 is directly covered with first sealing resin 6a in this region.

Also in the present embodiment, the effect as described in the sixth embodiment can be achieved. In the present embodiment, at least first component 41 is doubly surrounded by first conductor film 5c and shield film 8. Therefore, shielding performance for first component 41 can be enhanced. Although component 42 is not covered with first conductor film 5c in the present embodiment, it is surrounded by shield film 8, and thus a certain degree of shielding performance can be exhibited also for component 42. Hence, reliability of module 106 as a whole can be enhanced.

Figure 32:
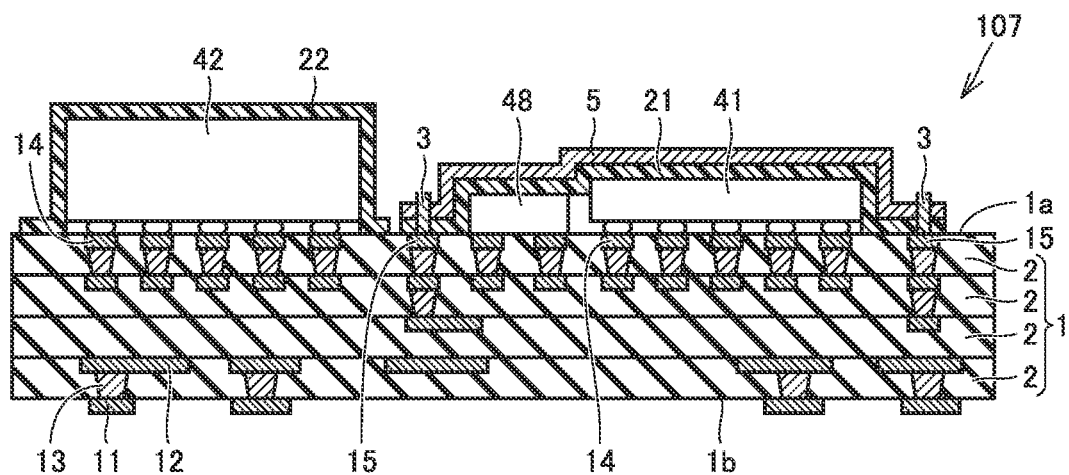
FIG. 32 is a cross sectional view of a variation of the module in the seventh embodiment based on the present disclosure.

It should be noted that a configuration such as a module 107 shown in FIG. 32 is also conceivable as a variation. Although module 107 has a basic configuration in common with that of module 106, module 107 is not provided with first sealing resin 6a and shield film 8. Instead, in module 107, component 42 is covered with a resin film 22. Resin film 22 is spaced from resin film 21. Resin film 22 is formed separately from resin film 21. Resin film 22 may be made of the same type of material as that for resin film 21.

In module 107, a certain degree of shielding performance can be secured for first component 41. Component 42 can be protected by resin film 22.

It should be noted that the following can be said for the first embodiment. As shown in FIGS. 1 to 3, module 101 includes component 43 as a third component mounted on first surface 1a, and second conductor film 5b. Resin film 21 covers the third component along a shape of the third component, and also covers a part of first surface 1a. Second conductor film 5b covers at least a part of resin film 21 along the shape of the third component, and covers at least a part of a portion in which resin film 21 covers the part of first surface 1a. First conductor film 5a and second conductor film 5b are spaced from each other. With such a structure in which, for a plurality of components to pay attention to, resin film 21 is integral, whereas the conductor film is divided for each component, it is possible to avoid occurrence of propagation of noise between different components, which is preferable.

The same also applies to module 104 in the fifth embodiment shown in FIGS. 22 to 24. The same also applies to module 105 in the sixth embodiment shown in FIGS. 25 to 27. In module 105, first conductor film 5c and second conductor film 5d are each further divided into the plurality of linear portions 5r, and thereby have a stripe shape. Also in such a configuration, with a structure in which the conductor film is divided for each component as shown in FIG. 25, it is possible to avoid occurrence of propagation of noise between different components, which is preferable. A structure in which the conductor film is divided for each component, and each divided conductor film has a stripe shape is preferable.

The type, the shape, the size, the number, the arrangement, and the like of the components shown in each embodiment described above are merely by way of example, and are not limited to those shown.

It should be noted that, of the embodiments described above, a plurality of embodiments may be adopted in an appropriate combination.

It should be noted that the embodiments disclosed herein are illustrative and non-restrictive in every respect. The scope of the present disclosure is defined by the scope of the claims, and is intended to include any modifications within the scope and meaning equivalent to the scope of the claims.

1: substrate; 1a: first surface; 1b: second surface; 2: insulating layer; 3, 3i: conductor structure; 5, 5a, 5c: first conductor film; 5b, 5d: second conductor film; 5r: linear portion; 6a: first sealing resin; 6b: second sealing resin; 8: shield film; 11, 17: external electrode; 13: conductor via; 14: pad electrode; 15, 15e: ground electrode; 18: solder; 18e: solder paste; 21, 22: resin film; 25: opening (in the resin film); 26: head; 27: wire; 31: first end portion; 32: second end portion; 33: intermediate portion; 41: first component; 42, 43, 44, 46a, 46b, 46c, 46d, 47a, 47b, 47c, 48, 49: component; 50: connector; 51: ground conductor pattern; 52: patch antenna; 101, 102, 103, 104, 105, 106, 107: module.

The invention claimed is:

1. A module comprising:
a substrate having a first surface;
a first component mounted on the first surface;
a resin film covering the first component along a shape of the first component, and also covering a part of the first surface;
a first conductor film covering at least a part of the resin film along the shape of the first component, and also covering at least a part of a portion in which the resin film covers the part of the first surface; and
a conductor structure disposed to extend over a part of the resin film at a location where the first conductor film covers the first surface with the resin film being interposed therebetween, wherein
the conductor structure includes a first end portion, a second end portion, and an intermediate portion connecting the first end portion and the second end portion,
the first end portion is connected to the first surface,
the second end portion is also connected to the first surface, and the intermediate portion is in contact with the first conductor film.

2. The module according to claim 1, wherein the intermediate portion is disposed to extend over the first conductor film.

3. The module according to claim 2, wherein the first conductor film includes a plurality of linear portions disposed to be parallel to each other with being spaced from each other, and the conductor structure is disposed to extend over at least one of the linear portions in a width direction.

4. The module according to claim 3, wherein the conductor structure is a wire.

5. The module according to claim 3, wherein the conductor structure is a metal pin.

6. The module according to claim 3, wherein the module further comprises a first sealing resin disposed to cover the first surface, the first conductor film, and the resin film, and a shield film disposed to cover an upper surface and side surfaces of the first sealing resin.

7. The module according to claim 2, wherein the conductor structure is a wire.

8. The module according to claim 2, wherein the conductor structure is a metal pin.

9. The module according to claim 2, wherein the module further comprises a first sealing resin disposed to cover the first surface, the first conductor film, and the resin film, and a shield film disposed to cover an upper surface and side surfaces of the first sealing resin.

10. The module according to claim 1, wherein the first conductor film covers the intermediate portion.

11. The module according to claim 10, wherein the conductor structure is a wire.

12. The module according to claim 10, wherein the conductor structure is a metal pin.

13. The module according to claim 1, wherein the conductor structure is a wire.

14. The module according to claim 1, wherein the conductor structure is a metal pin.

15. The module according to claim 1, wherein the module further comprises a first sealing resin disposed to cover the first surface, the first conductor film, and the resin film, and a shield film disposed to cover an upper surface and side surfaces of the first sealing resin.

16. The module according to claim 1, wherein the substrate has a second surface as a surface opposite to the first surface, and the module further comprises a second component mounted on the second surface.

17. The module according to claim 16, wherein the module further comprises a second sealing resin disposed to cover the second surface and the second component.

18. The module according to claim 1, further comprising an antenna.

19. The module according to claim 18, wherein the substrate has a second surface as a surface opposite to the first surface, and the antenna is disposed inside the substrate along the second surface.

20. The module according to claim 18, further comprising:
a third component mounted on the first surface; and
a second conductor film, wherein
the resin film covers the third component along a shape of the third component, and also covers a part of the first surface,
the second conductor film covers at least a part of the resin film along the shape of the third component, and covers at least a part of a portion in which the resin film covers the part of the first surface, and
the first conductor film and the second conductor film are spaced from each other.

* * * * *